(12) United States Patent
Massin et al.

(10) Patent No.: US 7,612,563 B2
(45) Date of Patent: Nov. 3, 2009

(54) FLOW-THROUGH MICROFLUIDIC NUCLEAR MAGNETIC RESONANCE(=NMR)-CHIP

(75) Inventors: Charles Massin, Grandson (CH); Michael Fey, Hornussen (CH)

(73) Assignee: Bruker Biospin AG, Faellanden (CH)

( * ) Notice: Subject to any disclaimer, the term of this patent is extended or adjusted under 35 U.S.C. 154(b) by 9 days.

(21) Appl. No.: 11/905,637

(22) Filed: Oct. 3, 2007

(65) Prior Publication Data

US 2008/0100296 A1    May 1, 2008

(30) Foreign Application Priority Data

Oct. 26, 2006   (EP)   .................. 06022373

(51) Int. Cl.
*G01V 3/00* (2006.01)
(52) U.S. Cl. .................. 324/321
(58) Field of Classification Search ......... 324/300–322; 600/410–435; 333/219–235; 343/824, 872–873, 343/905, 700 MS
See application file for complete search history.

(56) References Cited

U.S. PATENT DOCUMENTS

| | | | |
|---|---|---|---|
| 5,258,712 A | 11/1993 | Hofmann | |
| 5,585,723 A * | 12/1996 | Withers | 324/318 |
| 5,654,636 A | 8/1997 | Sweedler | |
| 6,025,719 A * | 2/2000 | Anderson | 324/318 |
| 6,194,900 B1 | 2/2001 | Freemann | |
| 6,201,392 B1 * | 3/2001 | Anderson et al. | 324/300 |
| 6,445,271 B1 * | 9/2002 | Johnson | 336/200 |
| 6,727,700 B2 * | 4/2004 | Marek | 324/318 |
| 6,727,702 B2 * | 4/2004 | Hammond et al. | 324/318 |
| 6,771,070 B2 * | 8/2004 | Lee | 324/318 |
| 6,822,454 B2 * | 11/2004 | Peck et al. | 324/321 |
| 7,138,801 B2 * | 11/2006 | Yamamoto et al. | 324/318 |
| 7,141,978 B2 * | 11/2006 | Peck et al. | 324/321 |
| 7,180,295 B2 * | 2/2007 | Tanaka | 324/321 |
| 7,388,377 B2 * | 6/2008 | Alvarez et al. | 324/311 |
| 7,397,246 B2 * | 7/2008 | Freytag et al. | 324/318 |
| 7,446,534 B2 * | 11/2008 | Withers | 324/322 |

OTHER PUBLICATIONS

Ronald L. Haver et al., "Small Volume Flow Probe for Automated Direct-Injection NMR Analysis", Journal of Magnetic Resonance 143, 69-78 (2000).

(Continued)

*Primary Examiner*—Brij B. Shrivastav
*Assistant Examiner*—Dixomara Vargas
(74) *Attorney, Agent, or Firm*—Paul Vincent (57) ABSTRACT

A flow-through microfluidic NMR-chip comprising a substrate (5) which is planar in an yz-plane with a sample chamber (2) within the substrate (5), the sample chamber (2) being elongated and having walls which run parallel to the z-direction, the substrate (5) having a thickness in x-direction of a Cartesian xyz-coordinate system between 100 μm and 2 mm, and at least one planar receiving and/or transmission coil (1, 1') with conductor sections (11) the coil (1, 1') being arranged at least on one planar surface of the substrate (5), wherein the extension of the sample chamber (2) along the z-direction exceeds the extension of the coil (1) along the z-direction is characterized in that the extension of the coil (1, 1') along the z-direction is larger than its extension along the y-direction. The inventive NMR-chip facilitated NMR-spectroscopic measurements with improved resolution, sensitivity as well as B1 homogeneity.

20 Claims, 9 Drawing Sheets

OTHER PUBLICATIONS

Wensink, Henk et al. "Measuring reaction kinetics in a lab-on-a-chip by microcoil NMR". Lab Chip. 2005, 5. 280-284.

Van Bentum P.J.M. et al. "Towards nuclear magnetic resonance µ-spectroscopy and µ-imaging". Analyst. 2004, 129, 793-803.

Sorli, B. et al. "Micro-spectrometer for NMR: analysis of small quantities in vitro". Meas. Sci. Technol. 15 (2004) 877-880.

Massin, C. at al. "Planar microcoil-based microfluidic NMR probes". Journal of Magnetic Resonance 164 (2003) 242-255.

Trumbull, J. D. at al. "Integrating Microfabricated Fluidic Systems and NMR Spectroscopy". IEEE Transactions on Biomedical Engineering, vol. 47, No. 1. Jan. 2000.

Syms, R.R.A. et al. "MEMS Helmholtz coils for magnetic resonance imaging". J. Micromech. Microeng. 15 (2005) S1-S9.

Walton, J.H. et al. "A Micromachined Double-Tuned NMR Microprobe". Anal. Chem. 2003, 75, 5030-5036.

* cited by examiner

FLOW-THROUGH MICROFLUIDIC NUCLEAR MAGNETIC RESONANCE(=NMR)-CHIP

This application claims Paris Convention priority of EP 06 022 373.2 filed Oct. 26, 2006 the complete disclosure of which is hereby incorporated by reference.

BACKGROUND OF THE INVENTION

The invention concerns a flow-through microfluidic nuclear magnetic resonance (=NMR)-chip comprising a substrate which is planar in an yz-plane with a sample chamber within the substrate, the sample chamber being elongated and having walls which run parallel to the z-direction the substrate having a thickness in x-direction of a Cartesian xyz-coordinate system between 50 μm and 2 mm, and at least one planar receiving and/or transmission coil with conductor sections the coil being arranged at least on one planar surface of the substrate, wherein the extension of the sample chamber along the z-direction exceeds the extension of the coil along the z-direction.

Such a flow-through microfluidic NMR-chip is known from [6].

Small-volume samples for nuclear magnetic resonance (NMR) spectroscopy consist for example of less than a few microliters of an analyte in solution. Such small samples are conveniently handled using microfluidic channels fabricated in different types of substrates, together with valves, pumps, and other miniaturized sample preparation and transportation means. NMR analysis in so-called lab-on-a-chip or micro total analysis systems (microTAS) is of great interest. However, because NMR has inherently a low sensitivity and since the NMR signal is proportional to the sample volume, signal-to-noise ratio becomes very weak for such small samples. One of the means to increase the sensitivity of the NMR experiment for small-volume sample is the use of miniaturized radio frequency (=RF) coils for signal detection. Coils which show dimensions of a few millimeters down to tens of micrometers can be fabricated by photolithography directly on the microfluidic substrate. Nevertheless, the quality of NMR spectra obtained so far from samples contained in microfluidic NMR-chips has been rather poor and appropriate coil-sample configurations remain to be designed in order to improve the NMR detection performance.

In [1] an NMR apparatus is disclosed wherein a planar, lithographic microcoil is fabricated onto a substrate onto which has been etched or grooved channels to serve as capillaries through which analytical compound flows. [2] describes an integrated miniaturized device for processing and NMR detection of liquid phase samples. Essential performance criteria of an NMR probe are its spectral resolution, sensitivity and homogeneity of the RF field of the microcoil (=B1 homogeneity). While the NMR detection performance is largely determined by the NMR coil—sample configuration, none of the above mentioned documents describes an arrangement yielding good NMR performance. In fact, the NMR performance of planar microcoils to date has been rather poor, in particular with respect to spectral resolution.

Figure 17:
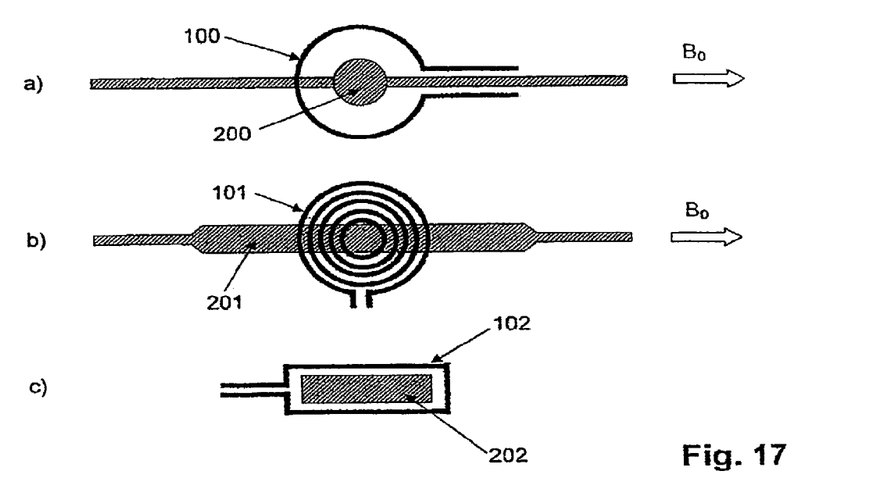
FIG. 17a shows a circular coil geometry combined with a spherical sample chamber according to [5] (PRIOR ART)
FIG. 17b shows a straight channel in line with the static magnetic field combined with a multi-turn circular microcoil placed in the central region of the channel according to [6] (PRIOR ART)
FIG. 17c shows a rectangular coil geometry combined with a rectangular cavity of dimensions smaller than the coil according to [3] (PRIOR ART)

In [3] a rectangular Helmholtz coil geometry with the aim of improving B1 homogeneity is proposed, as shown in FIG. 17c. The coil 102 was combined with a rectangular closed cavity 202 of dimensions smaller than the dimensions of the coil 102 for sample containment. The authors acquired a proton spectrum of a vinyl plastisol material at 63.5 MHz, which resulted in a very broad spectrum.

Figure 18:
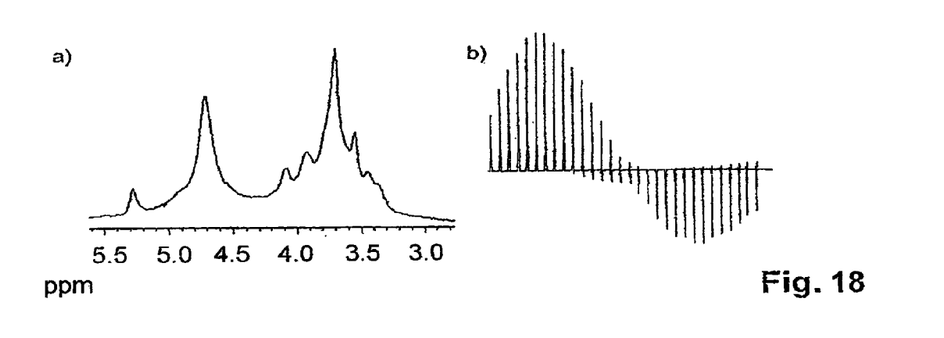
FIG. 18a shows the spectral resolution on a sucrose sample with a configuration according to [4] (PRIOR ART)
FIG. 18b shows the nutation curve illustrating B1 homogeneity for a configuration according to [4] (PRIOR ART).

In [4] a flow-through microfluidic NMR-chip is disclosed with an enlarged sample chamber and a planar circular coil. A proton spectrum of sucrose obtained from that prior art microfluidic NMR-chip configuration is illustrated in FIG. 18a. The spectrum was acquired at 300 MHz with a 1M sucrose sample concentration in $D_2O$. The microcoil was a two-turn circular spiral with an inner diameter of 2 mm. The active sample volume was 470 nL. The measured linewidth was 20 Hz and splitting of the anomeric proton peak could not be observed. B1 homogeneity performance of the same prior art microfluidic NMR-chip configuration is illustrated in FIG. 18b. The signal amplitudes measured for a 270° was 54% of that obtained for a 90° pulse. Typical specifications for a conventional NMR probe require at least 50% signal amplitude for an 810° pulse. This prior art configuration was far from meeting these specifications.

Walton et al. [5] used a circular coil geometry 100 in combination with a spherical sample chamber 200 (FIG. 17a). The authors did not acquire $^1H$ spectra, but derived qualitative proton line widths on the order of 20 Hz (at 300 MHz) from $^{31}P$ measurements. It is pointed out that standard shim coils were ineffective in further improving the resolution. With a linewidth of 20 Hz, fine features of proton spectra (such as J-coupling) cannot be resolved. An additional drawback of their design is a low sensitivity due to a small filling-factor.

In order to improve spectral resolution, the configuration illustrated in FIG. 17b was proposed by Wensink et al. [6]. It consists of a straight channel 201 in line with the static magnetic field combined with a circular microcoil 101 placed in the central region of the channel. With this configuration, the authors measured a linewidth of 1.3 Hz at 60 MHz. This value would correspond to a proton linewidth of 6.5 Hz at 300 MHz. This is still not adequate to perform high-resolution NMR spectroscopy. It can be shown that such a configuration would yield poor B1 homogeneity performance.

In summary, none of the prior art configurations simultaneously yielded a good spectral resolution, high sensitivity and large B1 homogeneity.

It is therefore an object of the invention to suggest a flow-through microfluidic NMR-chip with improved resolution, sensitivity as well as B1 homogeneity in order to achieve good NMR performance within microfluidic NMR-chips.

SUMMARY OF THE INVENTION

This object is achieved by the extension of the coil along the z-direction being larger than its extension along the y-direction. The coil comprises coil conductor sections which run mainly in the z-direction. The thickness of the substrate in x-direction is preferably between 100 μm and 2 mm, in particular between 200 μm and 2 mm, most preferably between 200 μm and 1 mm.

The basic idea of the invention is to adjust the geometry of the coil and the geometry of the sample chamber in order to avoid B0 field distortions on the one hand and to improve B1 homogeneity on the other hand.

Spectral resolution is a direct consequence of distortions of the static magnetic field B0 introduced by the NMR probe within the sample. In the case of a microfluidic NMR-chip, B0 distortion is mainly determined by the sample chamber shape as well as coil geometry and positioning of the wires with respect to the sample chamber. Sensitivity and B1 homogeneity are mainly determined by the characteristics of the B1 magnetic field produced by the NMR coil within the sample volume. The spatial dependence of the B1 field depends on the coil geometry and arrangement with the sample chamber.

Due to the elongated sample chamber distortions of the homogeneity of the static magnetic field in the central region of the sample chamber can be avoided or at least minimized. The inventive NMR-chip comprises a coil which is also elongated in z-direction. The center of the sample chamber and the center of the coil are preferably located at the same z-value. It is advantageous that the extension of the sample chamber in z-direction exceeds the extension of the coil in z-direction, in order to avoid negative effects at the edges of the sample chamber. Provided that the z-axis is aligned with the static magnetic field B0 this configuration, in which the sample chamber as well as a substantial portion of the coil are orientated in the z-direction, results in an improved B0 homogeneity, since the elongated sample chamber minimizes B0 distortion within the central part of the sample. The orientation of a substantial portion of the conducting wires along z-direction effects that no significant distortion of the B0 field within the sample volume takes place and therewith an improved spectral resolution can be achieved. Because of the orientation of the conducting wires along z-direction a homogeneous B1-field along the z-axis is produced. The inventive sample-coil arrangement improves the Signal to Noise ratio thus increasing sensitivity of the NMR-chip.

Compared to prior art, the inventive coil-sample configuration allows one to simultaneously improve spectral resolution while achieving high sensitivity and B1 homogeneity. The new configuration makes it possible to shim the sample using conventional shim systems since small scale distortions through the coil and chip are neglectable with this invention and only large scale distortions of the probe remain.

In a preferred embodiment the coil has a rectangular shape. In this case a maximum quantity of the conductor sections is oriented in z-direction therewith not disturbing the magnetic field B0 within the sample chamber. Note that this argument scales and thus is true for all sizes of coil ranging from 50 µm to several millimeter. However a convential shim system is fixed and does not scale with the coil. While there is not much influence on a small coil (e.g. 50 µm) it may have some influence for larger coils (e.g. some millimeters). Because of this, it should be noted that other coil geometries which show an elongated shape can also be suitable for lager coils, e.g. an elliptic shaped coil. In this case most of the conductor sections do not run parallel to the z-direction. Yet each conductor section can theoretically be split in a parallel part (projection on the z-direction) and a perpendicular part (projection perpendicular to z-direction). The object of the invention is achieved if the parallel parts of most of the conductor sections exceed the perpendicular part.

The ratio of the extension of the coil along the z-direction and the extension of the coil along the y-direction is preferably between 1.1 and 5.

It is advantageous if one coil is arranged on both outer surfaces of the substrate, which are connected to form a Helmholtz arrangement. With this configuration the B1 homogeneity can be further improved. The Helmholtz arrangement consists preferably of two mirror symmetric planar coils.

A preferred embodiment of the inventive NMR-chip provides a plurality of coils, in particular two coils, wherein each coil is tuned to a plurality of different frequencies. Therewith signals from different nuclei can be received.

In an advantageous development of this embodiment the coils are inductively decoupled. This leads to improved performance of multinuclear NMR experiments. It should be noted that any reduction of the difference in susceptibility is of advantage, it need not being "perfectly" matched.

Further preferred is an embodiment in which the conductor sections of the coils are arranged multilayered. Also microcoil cross-wires are preferably arranged multilayered. As a result, inductively decoupled coils can be fabricated onto one surface of the substrate in the same production process.

In a particularly preferred embodiment one of the coils is rectangular and the other coil forms a butterfly arrangement. The odd-symmetry of the x-component of the rf field produced by the butterfly coil in the xy plane allows one to efficiently decouple both coils.

In order to minimize distortion of the static magnetic field it is preferred that the magnetic susceptibilities of the coil conductor sections are matched to the susceptibilities of their respective environment, for example to nitrogen gas surrounding the coil wires. Microcoil cross-wires are then also matched to the susceptibilities of their respective environment.

It is advantageous when the coil is equipped with integrated shielding plates. The shielding plates prevent the RF field B1 to penetrate the sample in regions external from the coil thereby improving the field distribution. The shielding plates may comprise a copper layer acting as eddy current shielding.

The material of the coil comprises preferably copper, gold and/or silver.

It is advantageous if the ratio of the extension of the sample chamber along the z-direction and the extension of the coil along the z-direction is greater than 1.5. The sample chamber exceeds the extension of the coil in z-direction thereby reducing B0-distortion, which reduces with increasing length (extension in z-direction) of the sample chamber.

In a preferred embodiment of the inventive NMR-chip the substrate comprises two parts, which are bonded together. In at least one of the substrate parts an elongated channel is etched which form the sample chamber when the substrate parts are bonded together.

The substrate is preferably dielectric and electrical insulating, in particular made of glass, quartz or silica. In particular borosilicate glass is suitable as substrate material.

In a preferred embodiment the magnetic susceptibility of the substrate is matched to the susceptibility of a solvent, in particular to the susceptibility of water. Thus no susceptibility changes occur at the interface of the substrate and the solvent of the sample. Yet, this is only possible for one selected sample (preferable one which is investigated most often) or for an imaginary "averaged" sample, whose susceptibility is the average susceptibility of the most common samples.

It is preferred that the centers of the sample chamber, of the coil and of the substrate coincide within the yz-plane. This minimizes B0 distortion and facilitates shimming.

In a preferred embodiment the NMR-chip shows a length along the z-direction of less than 50 mm, in particular less than 25 mm, most preferably less than 20 mm, and a width along the y-direction of less than 30 mm, in particular less than 15 mm.

In a special embodiment two or more sample inlets are provided upstream of the sample chamber. Different samples can be mixed directly within the inventive NMR-chip.

The invention also concerns a NMR apparatus comprising a superconducting magnet, a NMR-spectrometer and a probe with a NMR-chip as described above, wherein the NMR-chip is aligned along a static magnetic field in z-direction, which is produced from the superconducting magnet in operation.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

Figure 1:
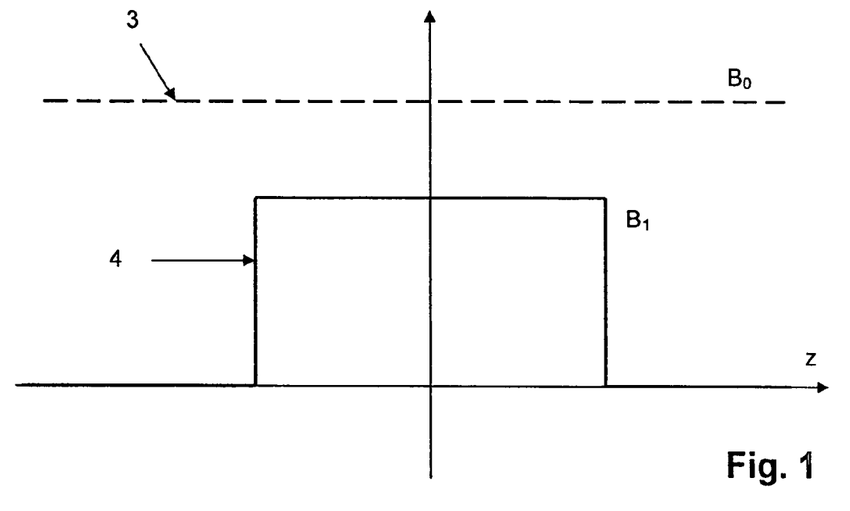
FIG. 1 shows optimal B0 and B1 field profiles (theoretical)

FIG. 1 shows an ideal B0 static magnetic field profile 3 and B1 RF field profile 4 to be achieved within a sample to be examined. With the inventive NMR-chip these ideal profiles can be approximated and thus good performance with microfluidic NMR-chips can be achieved.

Figure 2:
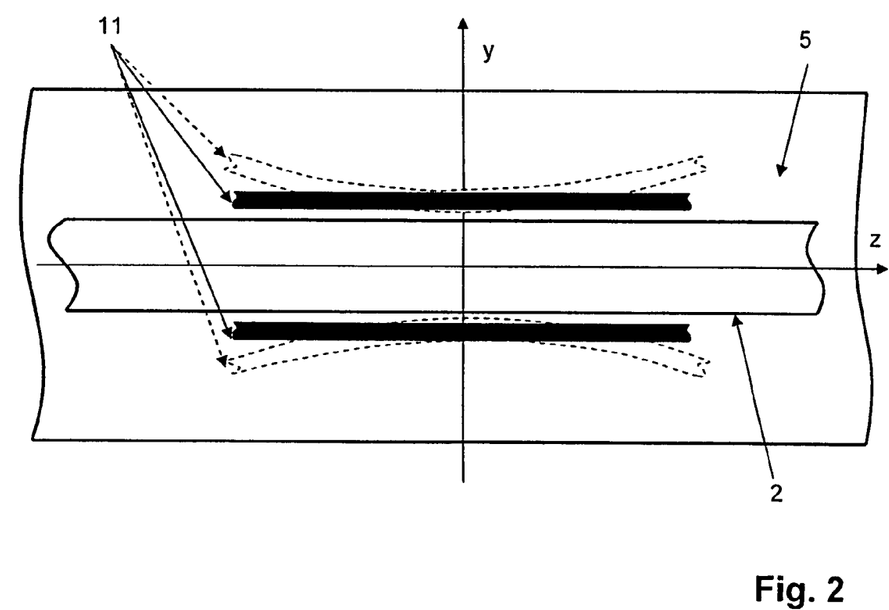
FIG. 2 shows a cut-out of a schematic top view of an inventive flow-through microfluidic NMR-chip.

A cut-out of the inventive NMR-chip is disclosed in FIG. 2. A sample chamber 2 within a planar substrate 5 is elongated and has walls which run parallel to the z-direction. A rectangular planar coil 1 is provided having conductor sections 11, which also run parallel to the z-direction, in the sense that projection of 11 on the z-axis is larger than the projection on the y-axis. The dashed lines show one of the possible deviations from the straight lines. For simplicity and without loss of generality we will only show the case of straight lines in the following figures. Closing sections of the coil 1 and of the sample chamber 2 are not represented in FIG. 2 on purpose for they will be discussed later. During use of the inventive NMR-chip within a NMR-spectrometer the static magnetic field B0 is aligned in z-direction (see FIG. 3). Since the elongated sample chamber 2 is also aligned in z-direction B0 distortion are minimized within the central part of the sample chamber 2. Conductor sections 11 do not produce significant distortion of the B0 field within the sample volume, and produce a homogeneous B1 field along the z-axis.

Figure 3:
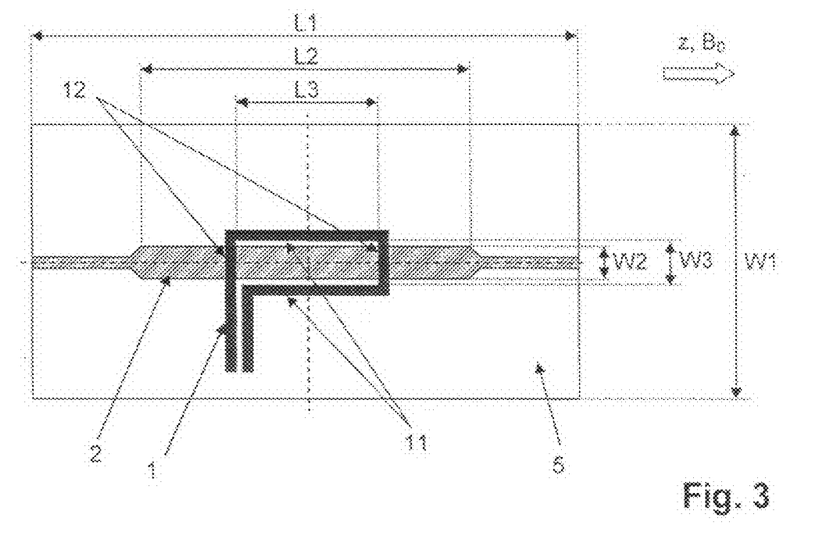
FIG. 3 shows a schematic top view of an inventive flow-through microfluidic NMR-chip.
Figure 4:
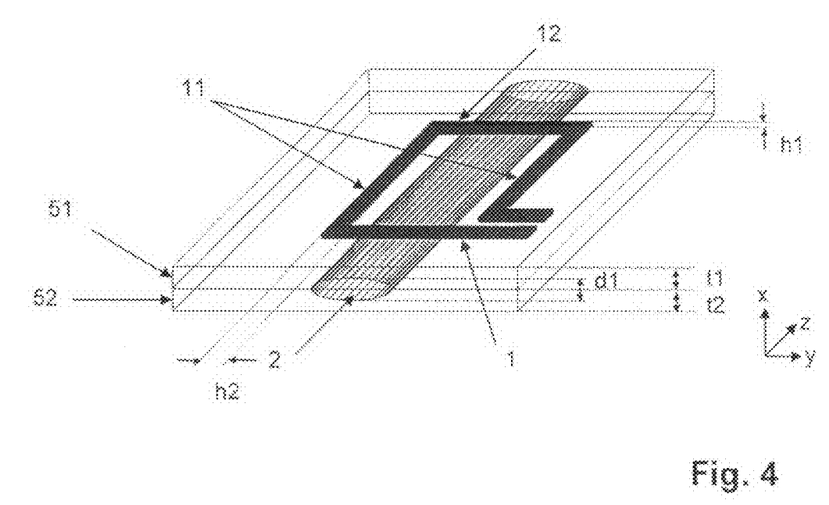
FIG. 4 shows a schematic perspective view of an inventive flow-through microfluidic NMR-chip.

FIG. 3 and FIG. 4 show a top view and a perspective view respectively of a preferred embodiment of the invention derived from the configuration shown in FIG. 2.

Figure 11:
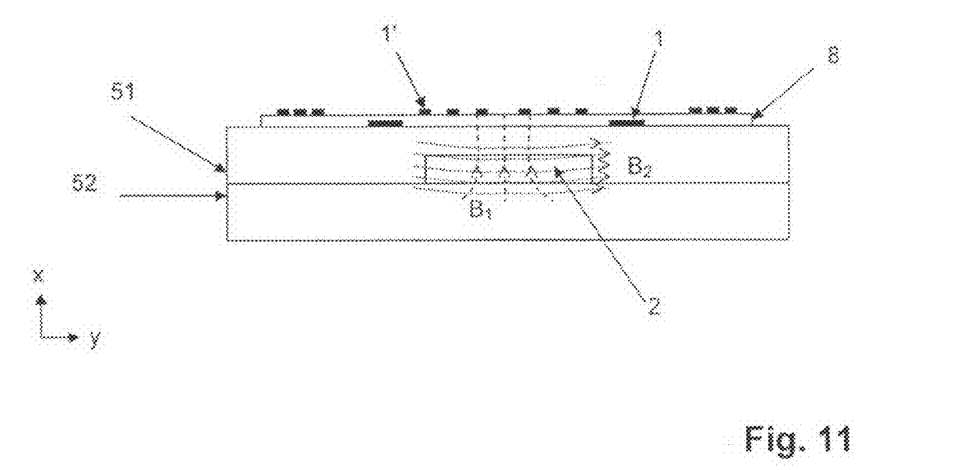
FIG. 11 shows a schematic cross sectional view of the NMR-chip according to FIG. 10.

The substrate 5 has a length L1, a width W1, is preferable made from a glass material or quartz. It comprises two substrate parts 51, 52 with thicknesses t1, t2 which are bonded together. An elongated channel is etched on the lower surface of a first planar substrate part 51 and on the upper surface of the second substrate part 52. The sample chamber 2 can also be formed by etching only one of the substrate parts 51, 52, as shown in FIG. 11. The dimensions of the inventive NMR-chip are mainly defined by the dimensions of the substrate:

Substrate surface (L1*W1)<15 cm$^2$
Substrate length 5 mm<L1<50 mm
Substrate width 3 mm<W1<30 mm (W1<L1)
Substrate thickness 100 µm<(t1+t2)<2 mm, The NMR sample chamber 2 is formed by the cavities etched in the first 51 and second planar glass substrate part 52, by assembling the substrate parts 51, 52 onto each other. The sample chamber 2 has a finite length L2, a width W2, and a channel depth d1, preferable with the following dimensions:

Sample chamber length 200 µm<L2<16 mm
Sample chamber width 50 µm<W2<2 mm (8*W2<L2)
Channel depth 50 µm<(2*d1)<1 mm
Sample chamber volume 4 nanoliter<V2<30 microliter The coil 1 has closing cross-wire sections 12 perpendicular to the z-axis. The length L3 of the coil 1 is greater than its width W3, thereby causing an elongated shape of the coil 1. Preferably coil 1 has a rectangular shape, but can also have another elongated shape, such as an ellipsoid. In case coil 1 is used as a proton coil (i.e. for exciting $^1$H-nuclei) its wires are advantageously made of copper (Cu), silver (Ag) or gold (Au). For optional compensation of magnetic susceptibility other materials may be added. Both single and multiple turn coils are suitable for NMR-spectroscopy purposes. The preferred dimensions for a rectangular coil 1 are the following:

Coil wire thickness 5 µm<h1<50 µm (h1>2*skin depth)
Coil wire width 10 µm<h2<800 µm
Coil surface (L3*W3)<40 mm2
Coil length 100 µm<L3<10 mm (1.5*L3<L2)
Coil width 100 µm<W3<5 mm (W2<W3<2*W2 and W3<L3).

Figure 5:
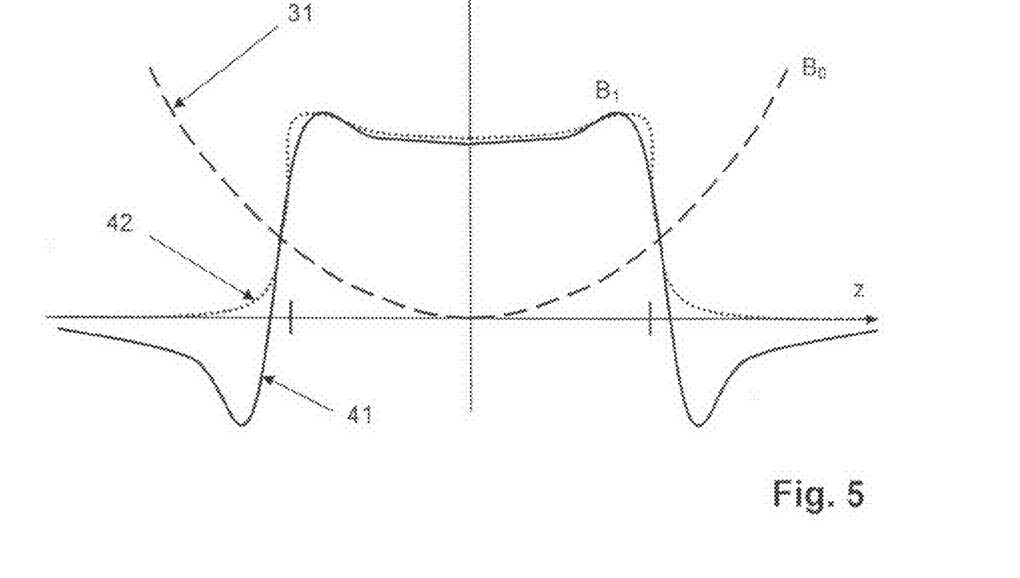
FIG. 5 shows the B0 profile produced by an elongated sample chamber and a B1 profiles for a rectangular coil with and without shielding plates.

FIG. 5 shows a realistic B0 field profile 31 and a B1 field profile 41 corresponding to the embodiment disclosed in FIG. 3. The finite length L2 of the sample chamber 2 produces a B0 distortion 31 proportional to $z^2$. However, for larger coil (in millimeter range) this $z^2$ distortion can be compensated using standard room-temperature shims of commercially available magnets. For small coils (100 μm, range) this distortion can not be shimmed and it is important that the sample chamber exceeds the length of the coil. The B1 field profile 41 produced by the coil 1 resembles the ideal rectangular field profile 4, apart from negative field regions caused by the coil cross-wires 12.

Figure 6:
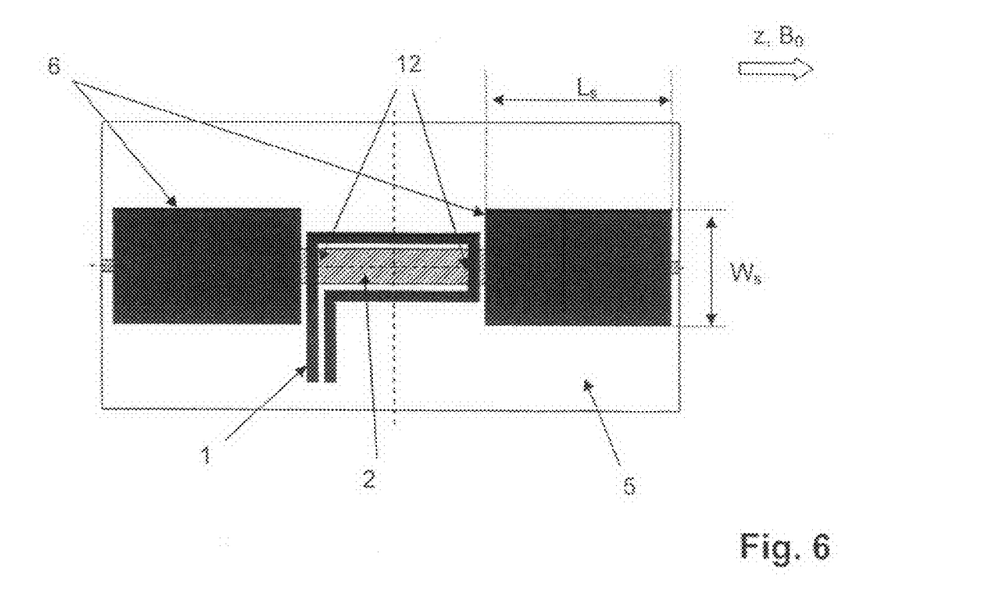
FIG. 6 shows a schematic top view of an inventive flow-through microfluidic NMR-chip with integrated shielding plates.

An arrangement allowing one to eliminate those negative B1 field values produced by the coil cross-wires 12 is disclosed in FIG. 6. The NMR-chip 5 comprises integrated shielding plates 6, which are placed above and below the coil 1 in z-direction in order to cover those parts of the sample chamber 2 which are not covered by the coil 1 therewith preventing the RF field B1 to penetrate the sample in regions external from the coil 1. The coil 1 and the shielding plates 6 are preferably arranged within the same plane. The corresponding B1 field profile 42 is illustrated in FIG. 5, and becomes very close to the ideal rectangular field profile 4 of FIG. 1. The shielding plates may comprise copper layers which act as an eddy current shielding. Said copper shielding plates 6 may show a thickness of 10 μm (at least twice the skin depth at the working frequency and preferably equal to the coil thickness h1) and a length $L_s$ of 3 mm (Ls>(L2−L3)/2). The width $W_s$ of the shielding plates 6 should be greater than the width W2 of the sample chamber.

Figure 7:
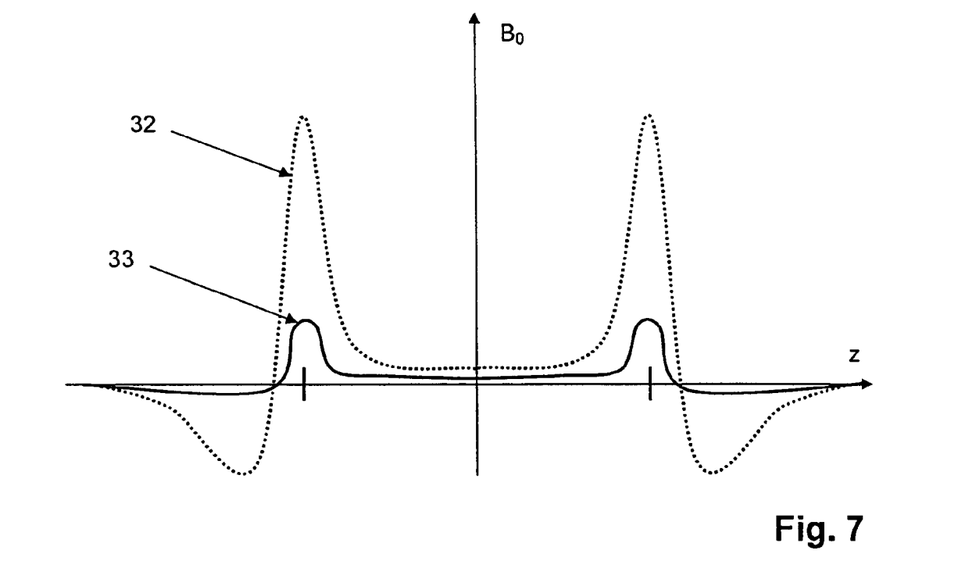
FIG. 7 shows a B0 distortion produced by a cross-wire section of a rectangular coil with and without magnetic susceptibility compensation.
Figure 8:
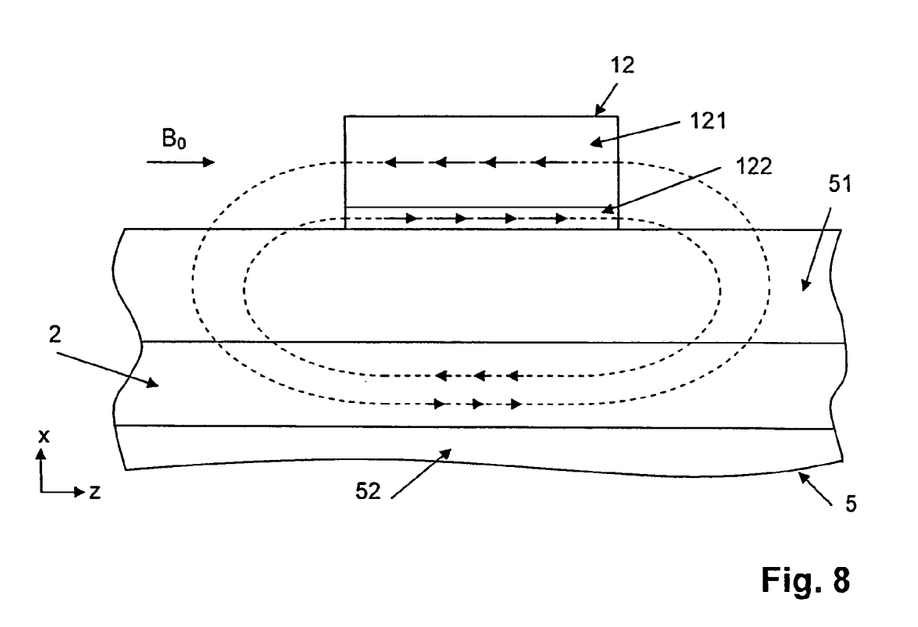
FIG. 8 shows the principle of susceptibility compensation using layered conductors.

In addition to B0 distortion 31 produced by the finite length L2 of the sample chamber, a B0 distortion 32 produced by diamagnetic coil cross-wires 12 is illustrated in FIG. 7. Such a B0 distortion 32 is difficult to shim and limits the overall spectral resolution at high static field B0. The distortion 32 of the static field B0 can be further reduced by adding a compensating layer 122 between the substrate 5 and the coil conductor 121 of the coil cross wire 12 as shown in FIG. 8. The susceptibility of the compensating layer 122 has to have the opposite sign as the susceptibility of the coil conductor 121. The effect of such a compensating layer 122 on B0 distortion is illustrated in FIG. 7 (profile 33). One can see that the B0 distortion 32 produced by diamagnetic coil cross-wires 12 is distinctly reduced.

Figure 9:
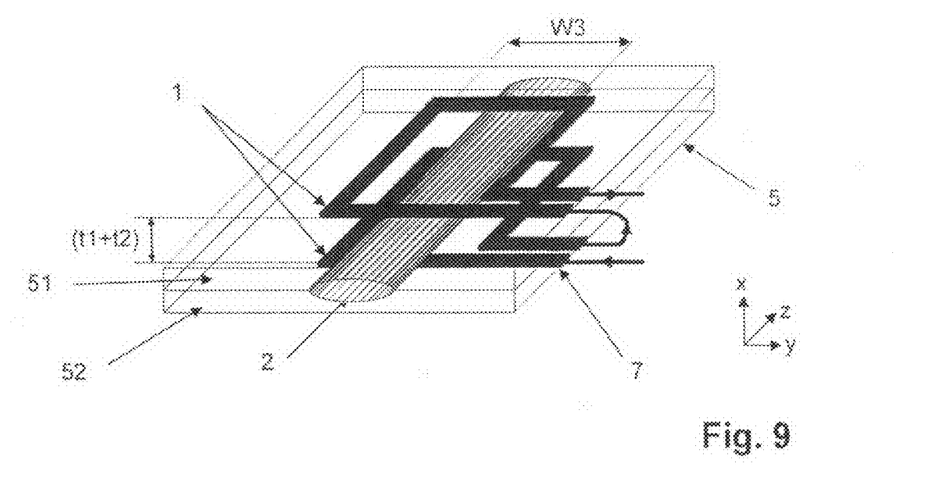
FIG. 9 shows a schematic perspective view an inventive flow-through microfluidic NMR-chip with an integrated Helmholtz microcoil arrangement.

An embodiment of the invention featuring two coils 1, each on one external surfaces of the substrate 5 is disclosed in FIG. 9. The coils 1 are connected to form a Helmholtz arrangement 7. A high B1 homogeneity performance can be obtained when the coil widths W3 are approximately equal to twice the substrate thickness (t1+t2).

Figure 10:
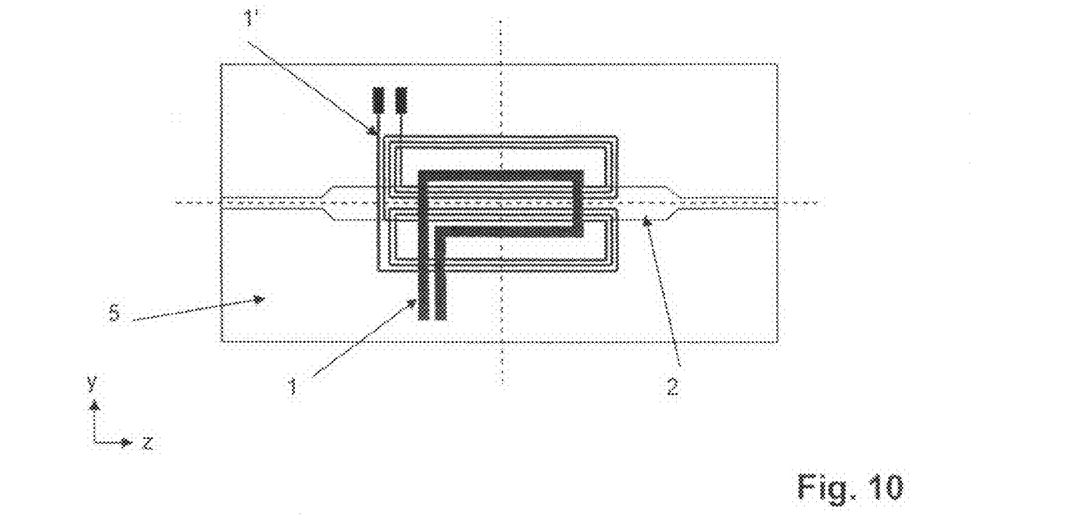
FIG. 10 shows a schematic top view of an inventive flow-through microfluidic NMR-chip comprising two inductively decoupled coils, one of them forming a butterfly coil geometry.

FIG. 10 discloses an embodiment of a flow-through microfluidic NMR-chip 5 comprising two inductively decoupled coils 1, 1', one of them forming a butterfly coil geometry 1'. A cross-section view of this embodiment is illustrated in FIG. 11. Coil 1 produces a RF field B1 mainly along the x-axis within the sample chamber 2 and is preferably tuned to proton frequency. Coil 1' produces an RF field B2 mainly along the y-axis within the sample chamber 2 and is preferably tuned to lower frequency nuclei, for example carbon. The two coils 1, 1' can be produced by photolithography on the same surface of the substrate 5 and are separated by an electrically insulating layer 8 as shown in FIG. 11.

Figure 12:
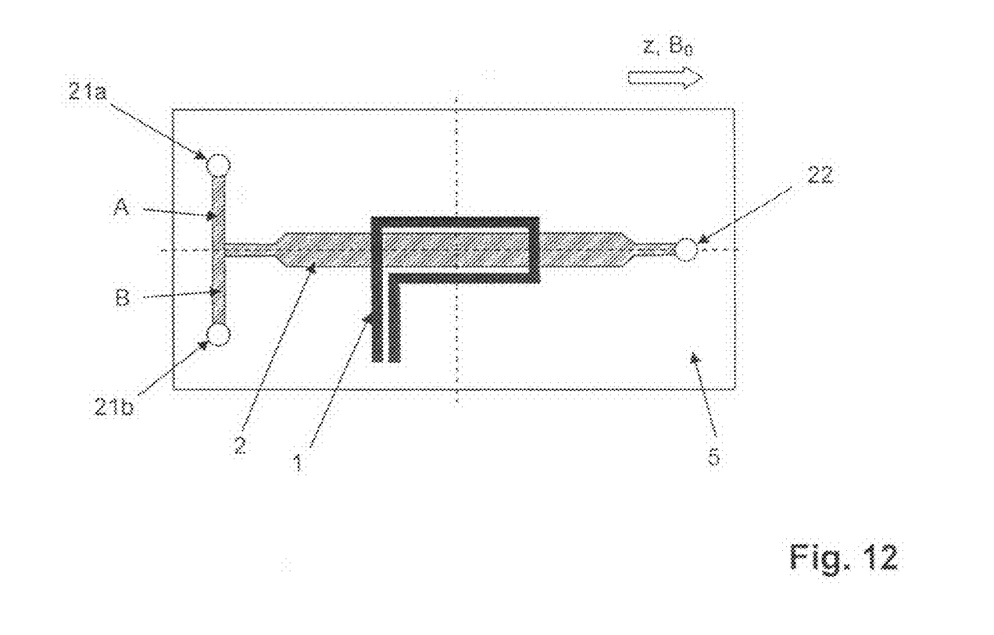
FIG. 12 shows a schematic top view of an inventive flow-through microfluidic NMR-chip comprising two sample inlets upstream of the sample chamber.

An embodiment of the present invention comprising two sample inlets 21a, 21b upstream of the sample chamber 2 is shown in FIG. 12. Such a NMR-chip allows one to introduce two different fluid samples A, B, one through each sample inlet 21a, 21b, and to monitor interaction between sample A and sample B by NMR while flowing the samples through the NMR-chip to an outlet 22.

Figure 13:
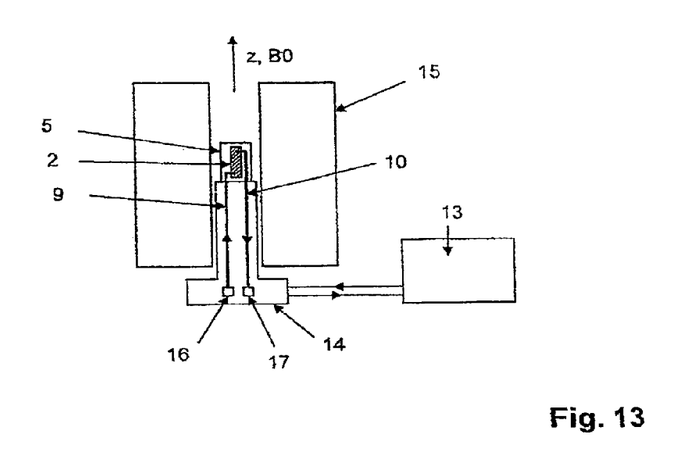
FIG. 13 shows a schematic a schematic top view of an inventive NMR-apparatus for spectrometer applications with an inventive NMR-chip.

FIG. 13 shows inventive microfluidic NMR-chip arranged within a superconducting magnet arrangement for use with a NMR-spectrometer 13. The NMR-chip is mounted on a probe 14. The end portions of the sample chamber 2 are connected to an inlet capillary 9 and an outlet capillary 10 respectively. The probe 14 is placed within a super-conducting magnet 15 so that the elongated sample chamber 2 along z-axis is aligned with the static field B0 of the superconducting magnet 15. A sample can be introduced into the NMR-chip through a sample port 16 via the inlet capillary 9 and can be taken out of the sample chamber through an outlet port 17 via the outlet capillary 10.

Compared to prior art, the present invention improves NMR detection performance within microfluidic NMR-chips in many respects. These improvements are illustrated for two examples of possible embodiments.

The first example deals with a flow-through microfluidic NMR-chip with an integrated Helmholtz microcoil as shown in FIG. 9. The microfluidic NMR-chip was formed by bonding together two glass substrates 51 and 52 with thickness t1=t2=500 μm, each comprising an etched half-channel. The resulting substrate 5 thickness was 1 mm. The sample chamber depth d1 was 300 μm, width W2 was 1.2 mm and length L2 was 11.2 mm. Rectangular coils were patterned by photolithography on both surfaces of the NMR-chip. The coil width W3 was 2 mm and the length L3 was 2.8 mm. The coil wire was made of copper with a width 80 μm and thickness h1=15 μm. The active volume was 1 μL while the total volume in the NMR-chip was 4.8 μL. The glass NMR-chip dimensions were 22 mm (L1)×10 mm (W1).

Figure 14:
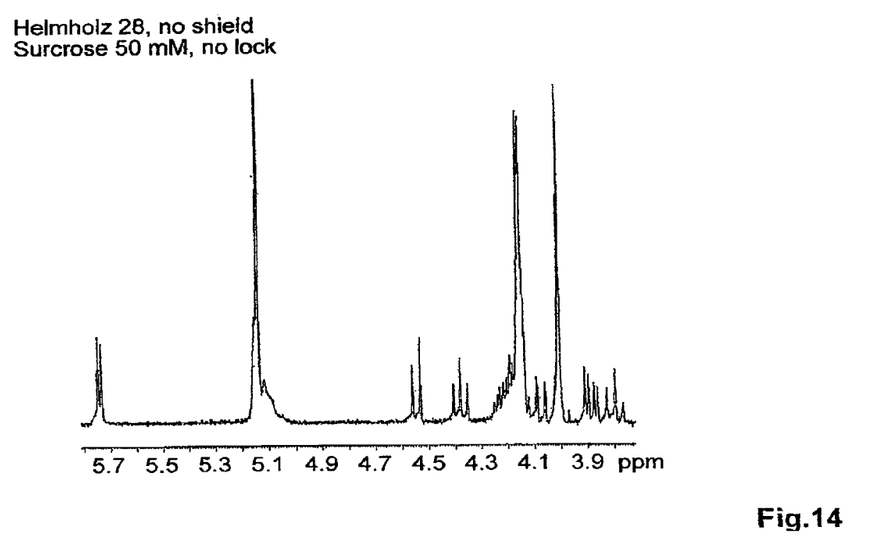
FIG. 14 shows a proton NMR spectrum of sucrose derived by a preferred embodiment of the inventive NMR-chip.

FIG. 14 illustrates a proton NMR spectrum of sucrose acquired at 300 MHz using this example embodiment. The sample was 50 mM of sucrose in $D_2O$. The splitting measured on the anomeric proton was 20%. The Signal-to-Noise (=SNR) value measured on the anomeric proton was 90 after 480 scans (with 0.7 Hz line broadening), corresponding to an SNR of 4.1/scan. This spectrum should be compared to the prior art spectrum of FIG. 18a. Note that although the magnetic susceptibility of the copper wires was not compensated in this example, the resulting spectral resolution was excellent as a result of the inventive configuration.

Figure 15:
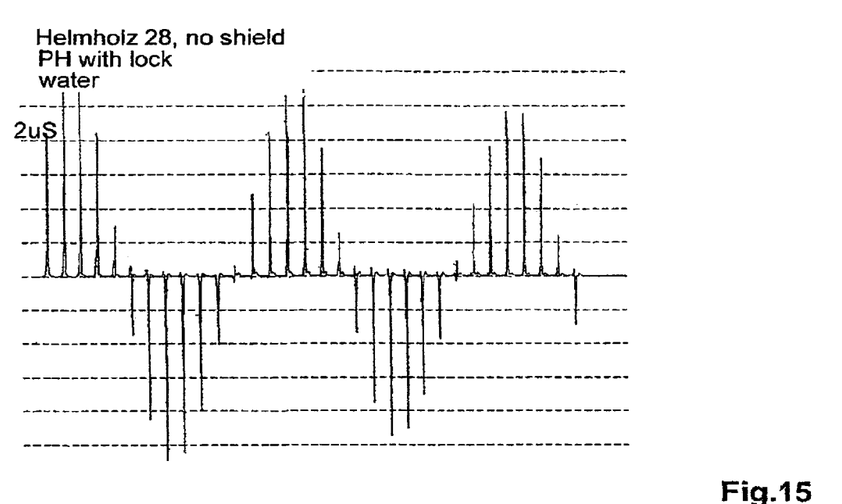
FIG. 15 shows the nutation curve illustrating B1 homogeneity for the configuration used for obtaining the NMR-spectrum of FIG. 14.

This example embodiment also provided excellent B1 homogeneity performance as illustrated in FIG. 15. The excitation power was 16 W and the pulse duration was increased by increments of 1 μs, with a starting value of 2 μs. The signal amplitudes measured for a 450° and 810° pulse were respectively 96% and 86% of that obtained for a 90° pulse. This constitutes a large improvement compared to prior art performance illustrated in FIG. 18b.

Figure 16:
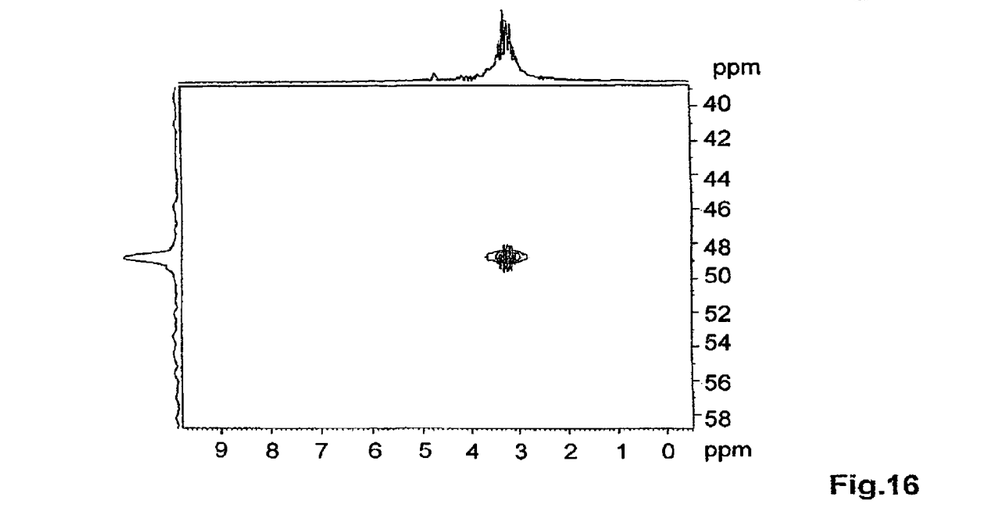
FIG. 16 shows a Heteronuclear Multiple Quantum Correlation (HMQC) spectrum measured with a NMR-chip shown in FIG. 10 and FIG. 11.

The second example deals with another embodiment of the present invention comprising two magnetically decoupled coils tuned to two different frequencies, as shown in FIG. 10 and FIG. 11. A channel with a depth of 150 μm was etched on the bottom surface of a 500 μm thick glass substrate 51. This first substrate was bonded with a second 500 μm thick substrate 52 to form a 1 mm thick microfluidic substrate 5. The sample chamber depth d1 was 150 μm, width W2 was 1.2 mm and length L2 was 11.2 mm. The total NMR-chip sample volume was 2.3 μL, including inlet and outlet channels. The glass NMR-chip dimensions were 22 mm (L1)×10 mm (W1). A rectangular coil 1 and a butterfly coil 1' were microfabricated on the top surface of the substrate 5, as shown in FIG. 10 and FIG. 11. The width W3 of the rectangular coil 1 was W3=2 mm and the length L3 was L3=2.8 mm. Thus, the active sample volume was 500 nL. The wire forming the coil 1 was copper with a width of 80 μm and thickness h1 of 10 μm. The rectangular microcoil 1 was doubled tuned to proton at 500 MHz and deuterium at 76 MHz. The butterfly microcoil 1' comprised 8 straight copper conductor sections producing an RF field $B_2$ parallel to the substrate surface within the sample chamber. The wire width for the butterfly coil 1' was 40 μm with 30 μm spacing between turns and thickness was 15 μm. The wires of the butterfly coil 1' were electrically insulated from the wires of the rectangular coil 1 using a patterned polymer layer 8. The butterfly coil 1' was tuned to 125 MHz for carbon observe or decoupling. The measured decoupling between 13C and 1H channels after building the tuning and matching circuit was −26.5 dB at 500 MHz. This decoupling value was appropriate to perform multinuclei NMR experiments. FIG. 16 illustrates an HMQC spectrum acquired at 500 MHz using this example embodiment. The sample was 1M 13CH3OH+10% $H_2O$+0.2 mg GdGl3/mL in $D_2O$.

LIST OF REFERENCE SIGNS

A Sample
B Sample
B0 Static magnetic field
B1 RF field
d1 Channel depth of the sample chamber
h1 Wire thickness of microcoil
h2 Wire width of microcoil
L1 Length of substrate (extension in z-direction)
L2 Length of sample chamber (extension in z-direction)
L3 Length of microcoil (extension in z-direction)
$L_s$ Length of shielding plates (extension in z-direction)
t1 Thickness of first substrate part (extension in x-direction)
t2 Thickness of second substrate part (extension in x-direction)
W1 Width of substrate (extension in y-direction)
W2 Width of sample chamber (extension in y-direction)
W3 Width of microcoil (extension in y-direction)y
$W_s$ Width of shielding plates (extension in y-direction)
1' Butterfly microcoil
1 Rectangular planar microcoil
2 Sample chamber
3 Ideal profile of the static magnetic field B0
4 Ideal profile of the RF magnetic field B1
5 Microfluidic substrate
6 RF shielding plate
7 Helmholtz microcoil
8 Electrically insulating layer
9 Inlet capillary
10 Outlet capillary
11 Straight conductor sections
12 Microcoil cross-wire
13 NMR-spectrometer
14 Probe head
15 Superconducting magnet
16 Inlet port
17 Outlet port
31 Profile of the static magnetic field B0 with $z^2$ distortion
32 Profile of the static magnetic field B0 distortion introduced by diamagnetic cross-wires
33 Profile of the static magnetic field B0 distortion introduced by cross-wires with susceptibility compensation
41 Profile of the RF magnetic field produced by a rectangular coil
42 Profile of the RF magnetic field produced by a rectangular coil with shielding plates
51 First planar substrate part
52 Second planar substrate part
100 Planar NMR microcoil (circular geometry)
101 Planar NMR microcoil (circular geometry)
102 Planar NMR microcoil (rectangular geometry)
121 Diamagnetic conductor layer
121 Paramagnetic layer
21a Sample inlet
21b Sample inlet
22 Sample outlet
200 Sample chamber (spherical geometry)
201 Channel
202 Closed cavity
[1] U.S. Pat. No. 5,654,636
[2] U.S. Pat. No. 6,194,900
[3] Syms et al., J. Micromech. Microeng. 15 (2005), S1-S9
[4] Massin et al., J Mag Res, 164, (2003), 242-255
[5] Walton et al., Anal. Chem., 75 (2003), 5030-5036
[6] Wensink et al., Lab Chip, 5, (2005), 280-284

We claim:

1. A flow-through microfluidic NMR-chip comprising:
a substrate which is planar in an yz-plane of an xyz Cartesian coordinate system and having a sample chamber within said substrate, said sample chamber being elongated and having walls which run parallel to a z-direction, said substrate having a thickness in an x-direction between 50 μm and 2 mm; and
at least one planar receiving and/or transmission coil having conductor sections, said coil being disposed on at least one planar surface of said substrate, wherein an extension of said sample chamber along said z-direction exceeds an extension of said coil along said z-direction, an extension of said coil along said z-direction being larger than an extension thereof along said y-direction, wherein one coil is disposed on each outer surface of said substrate.

2. The NMR-chip of claim 1, wherein said conductor sections are straight and run parallel to said z-direction.

3. The NMR-chip of claim 2, wherein said coils have a rectangular shape.

4. The NMR-chip of claim 1, wherein a ratio between extension of said coils along said z-direction and extension of said coils along said y-direction is between 1.1 and 5.

5. The NMR-chip of claim 1, wherein said coils connected to form a Helmholtz arrangement.

6. The NMR-chip of claim 1, wherein said conductor sections of said coil are multilayered.

7. The NMR-chip of claim 1, further comprising integrated coil shielding plates.

8. The NMR-chip of claim 1, wherein said coil comprises copper, gold, and/or silver.

9. The NMR-chip of claim 1, wherein a ratio between an extension of said sample chamber along said z-direction and an extension of said coil along said z-direction is greater than 1.5.

10. The NMR-chip of claim 1, wherein said substrate comprises two parts which are bonded together.

11. The NMR-chip of claim 1, wherein said substrate is dielectric, electrically insulating made from glass, made from quartz, or made from silica.

12. The NMR-chip of claim 1, wherein a magnetic susceptibility of said substrate is matched to a susceptibility of a solvent or to a susceptibility of water.

13. The NMR-chip of claim 1, wherein centers of said sample chamber, of said coil and of said substrate coincide within said yz-plane.

14. The NMR-chip of claim 1, wherein the chip has a length along said z-direction of less than 50 mm or less than 25 mm and a width along said y-direction of less than 30 mm or less than 15 mm.

15. The NMR-chip of claim 1, wherein at least two sample inlets are disposed upstream of said sample chamber.

16. An NMR apparatus comprising a superconducting magnet, an NMR-spectrometer, and a probe head having the NMR-chip of claim 1, wherein the NMR-chip is aligned along a static magnetic field (B0) produced by said superconducting magnet in said z-direction.

17. A flow-through microfluidic NMR-chip comprising:
a substrate which is planar in an yz-plane of an xyz Cartesian coordinate system and having a sample chamber within said substrate, said sample chamber being elongated and having walls which run parallel to a z-direction, said substrate having a thickness in an x-direction between 50 µm and 2 mm; and
at least one planar receiving and/or transmission coil having conductor sections, said coil being disposed on at least one planar surface of said substrate, wherein an extension of said sample chamber along said z-direction exceeds an extension of said coil along said z-direction, an extension of said coil along said z-direction being larger than an extension thereof along said y-direction, wherein at least two coils are provided, each coil tuned to a different frequency.

18. The NMR-chip of claim 17, wherein said coils are inductively decoupled from each other.

19. The NMR-chip of claim 17, wherein one of said coils forms a butterfly arrangement.

20. A flow-through microfluidic NMR-chip comprising:
a substrate which is planar in an yz-plane of an xyz Cartesian coordinate system and having a sample chamber within said substrate, said sample chamber being elongated and having walls which run parallel to a z-direction ,said substrate having a thickness in an x-direction between 50 µm and 2 mm: and
at least one planar receiving and/or transmission coil having conductor sections, said coil being disposed on at least one planar surface of said substrate, wherein an extension of said sample chamber along said z-direction exceeds an extension of said coil along said z-direction, an extension of said coil along said z-direction being larger than an extension thereof along said y-direction, wherein magnetic susceptibilities of said coil conductor sections are matched to susceptibilities of a respective environment thereof.

* * * * *